(12) United States Patent
Motoori et al.

(10) Patent No.: US 9,474,168 B2
(45) Date of Patent: Oct. 18, 2016

(54) ELECTRONIC MODULE AND METHOD FOR MANUFACTURING ELECTRONIC MODULE

(71) Applicant: SINFONIA TECHNOLOGY CO., LTD., Tokyo (JP)

(72) Inventors: Takenori Motoori, Tokyo (JP); Hideaki Moriya, Tokyo (JP); Hidetoshi Katada, Tokyo (JP)

(73) Assignee: SINFONIA TECHNOLOGY CO., LTD., Tokyo (JP)

( * ) Notice: Subject to any disclaimer, the term of this patent is extended or adjusted under 35 U.S.C. 154(b) by 0 days.

(21) Appl. No.: 14/811,275

(22) Filed: Jul. 28, 2015

(65) Prior Publication Data

US 2015/0334853 A1 Nov. 19, 2015

Related U.S. Application Data

(62) Division of application No. 13/732,881, filed on Jan. 2, 2013, now Pat. No. 9,131,599.

(30) Foreign Application Priority Data

May 21, 2012 (JP) .................................. 2012-115435

(51) Int. Cl.
*H05K 7/02* (2006.01)
*H05K 7/04* (2006.01)
(Continued)

(52) U.S. Cl.
CPC ............. *H05K 5/0004* (2013.01); *H01L 21/50* (2013.01); *H05K 5/0247* (2013.01); *H05K 7/1427* (2013.01); *H05K 13/00* (2013.01); *Y10T 29/49117* (2015.01)

(58) Field of Classification Search
USPC .................. 361/728–730, 752, 796, 800; 312/223.1–223.3
See application file for complete search history.

(56) References Cited

U.S. PATENT DOCUMENTS 3,571,771 A * 3/1971 Stephanson ............ H01H 50/14
174/50
4,370,516 A * 1/1983 Bailey, Jr. ............ H05K 5/0004
174/481

(Continued)

FOREIGN PATENT DOCUMENTS

JP 2001-214776 A 8/2001
JP 2005-340698 A 12/2005
(Continued)

OTHER PUBLICATIONS

Office Action dated Feb. 9, 2016, issued in counterpart Japanese Patent Application No. 2012-115435. (3 pages).

*Primary Examiner* — Hung S Bui
(74) *Attorney, Agent, or Firm* — Westerman, Hattori, Daniels & Adrian, LLP

(57) ABSTRACT

The Electronic Module includes body case 2 that comprises a plurality of case members 3, 4 by abutting each other and that has an internal space (S) where the first opening P1 is formed on one side surface of the internal space (S) and the second opening P2 that opens in a direction different from that of the first opening P1 is in an exposed state when a plurality of the case members 3, 4 are separated each other, a substrate 5 on which a sensor IC 51 is mounted and that is housed in the internal space (S) of the body case 2, and a resin body 6 that covers the substrate 5 by being filled in the internal space (S) of the body case 2 and solidified or hardened, and is characterized by that a plurality of the case members 3, 4.

7 Claims, 10 Drawing Sheets

(51) Int. Cl.
*H05K 5/00* (2006.01)
*H05K 13/00* (2006.01)
*H05K 5/02* (2006.01)
*H05K 7/14* (2006.01)
*H01L 21/50* (2006.01)

(56) References Cited

U.S. PATENT DOCUMENTS

| | | | |
|---|---|---|---|
| 4,829,432 A * | 5/1989 | Hershberger | H05K 9/0045 174/377 |
| 5,747,733 A * | 5/1998 | Woods | H02G 3/14 174/481 |
| 6,041,956 A * | 3/2000 | Kao | H05K 5/04 220/4.02 |
| 6,406,327 B1 | 6/2002 | Soon | |
| 6,499,621 B1 | 12/2002 | Yamaguchi et al. | |
| 9,331,421 B2 * | 5/2016 | Lai | H01R 13/5202 |
| 2004/0261835 A1 | 12/2004 | Utsunomiya et al. | |
| 2012/0236479 A1 | 9/2012 | Tamai et al. | |

FOREIGN PATENT DOCUMENTS

| | | |
|---|---|---|
| JP | 2008-211231 A | 9/2008 |
| JP | 2010-019693 A | 1/2010 |
| JP | 2010-164412 A | 7/2010 |

* cited by examiner

Fig.2
(a)
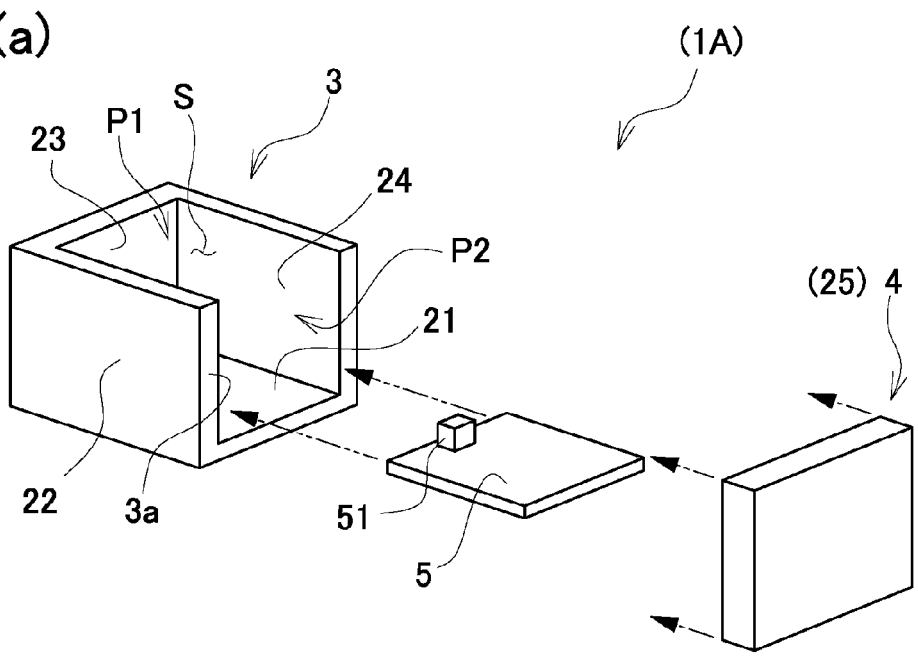
(b)
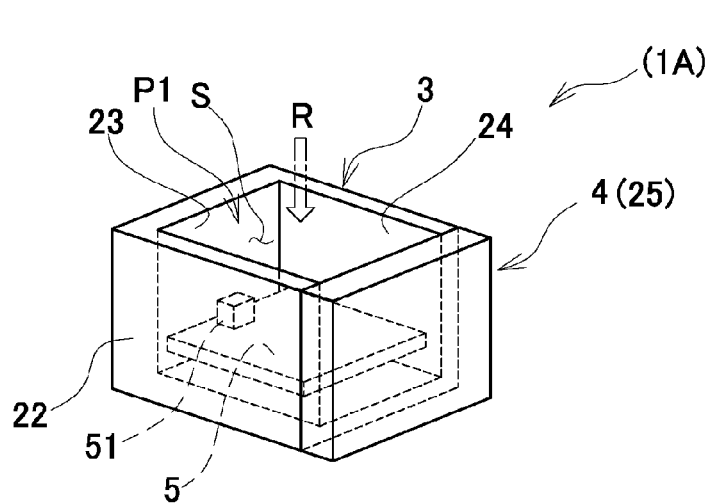

Fig.5
(a)
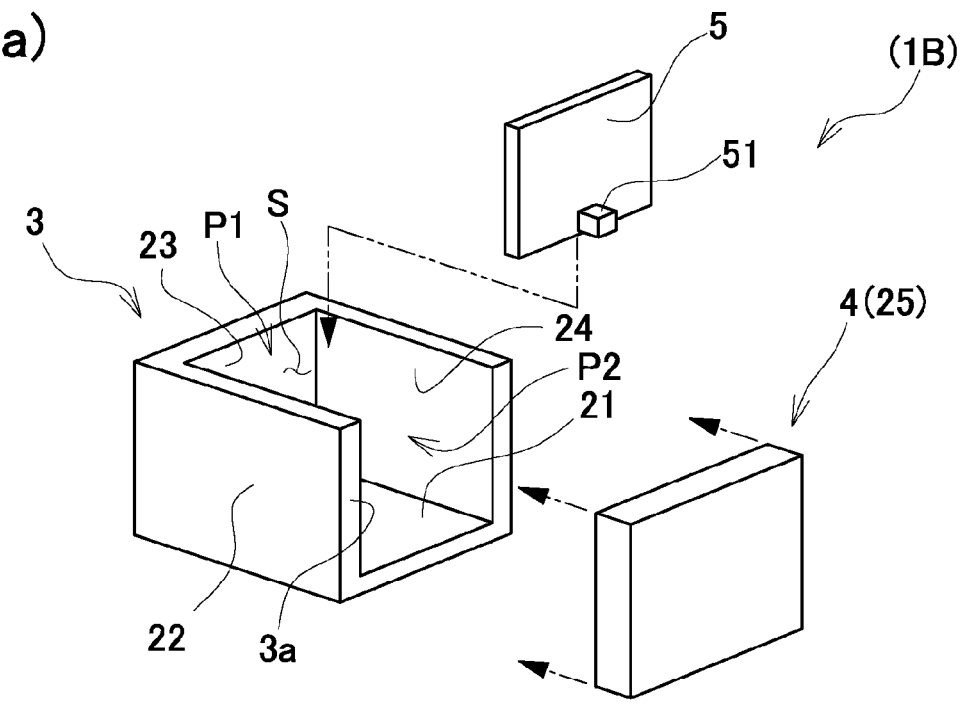
(b)
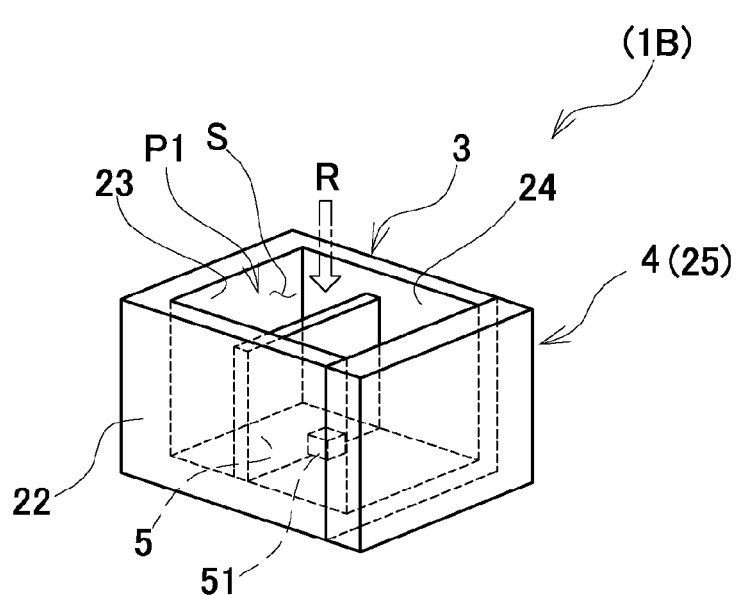

Fig. 6
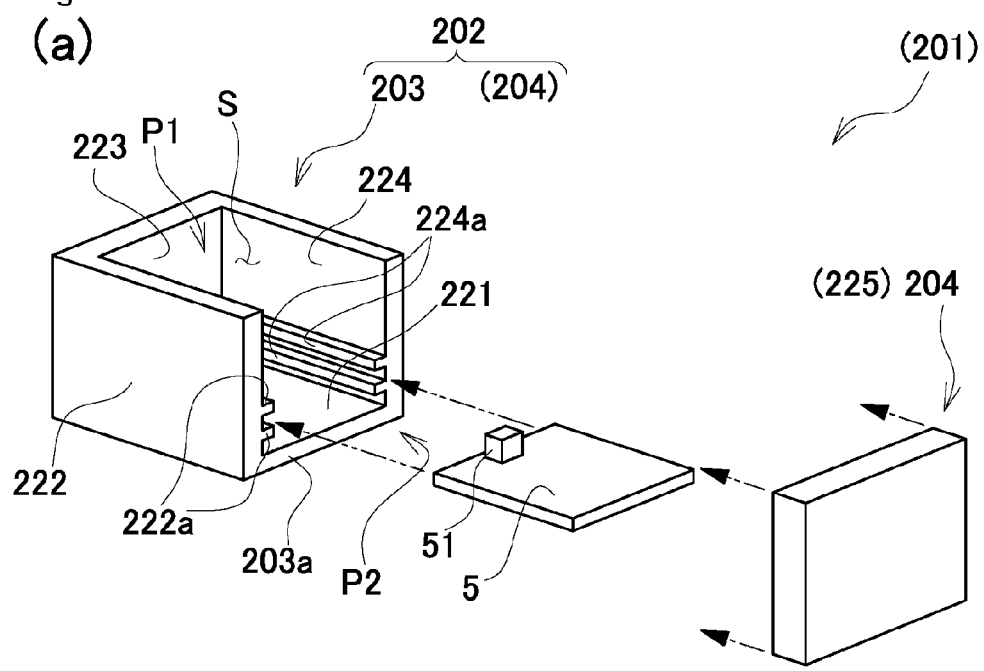
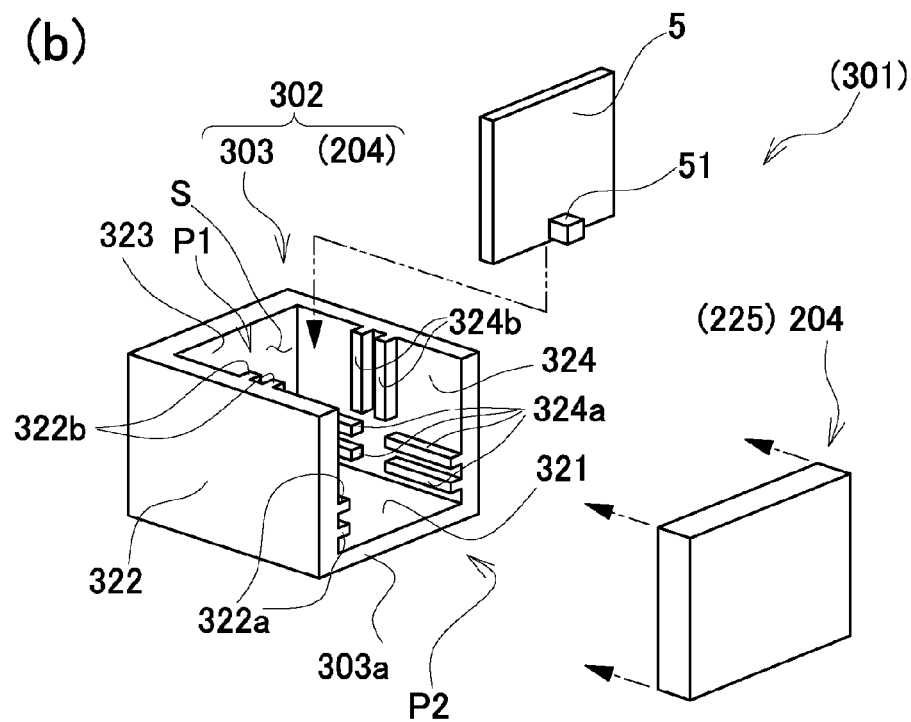

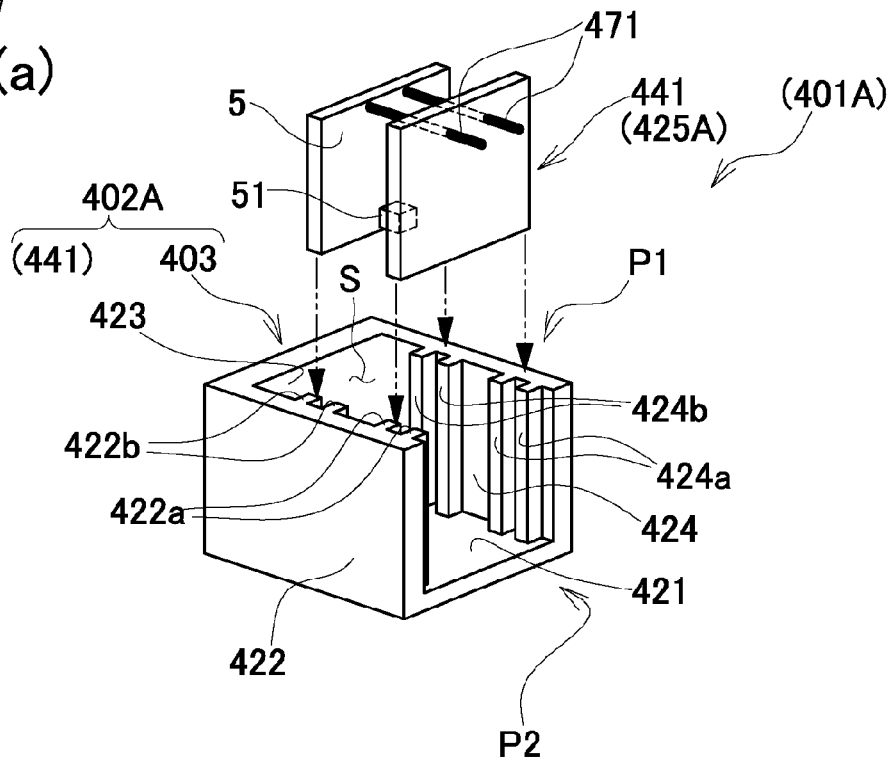
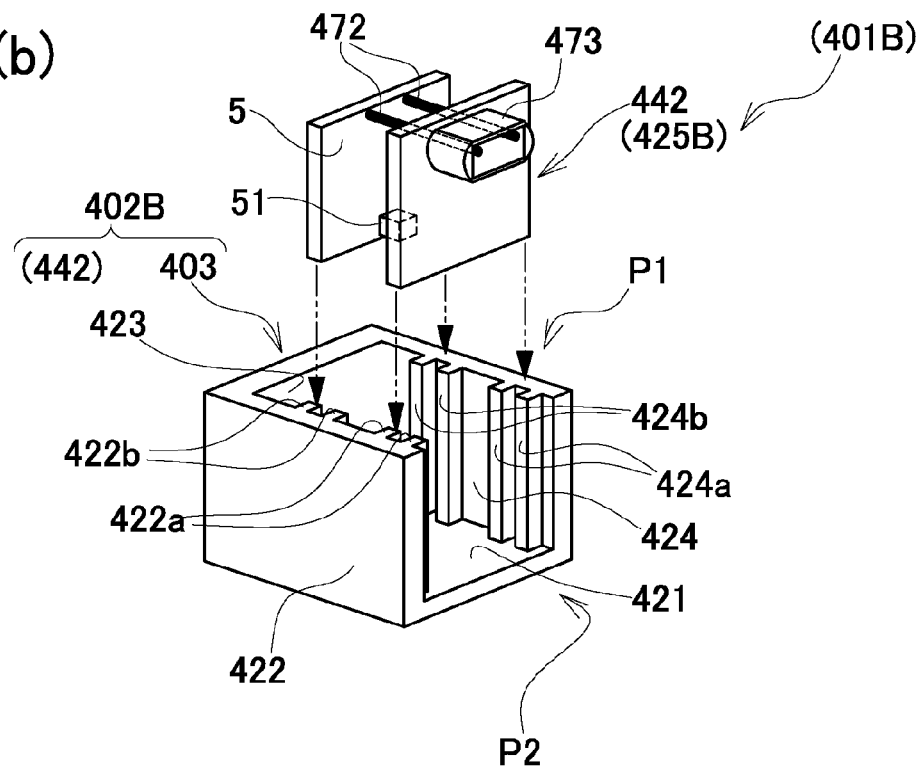
Fig.7

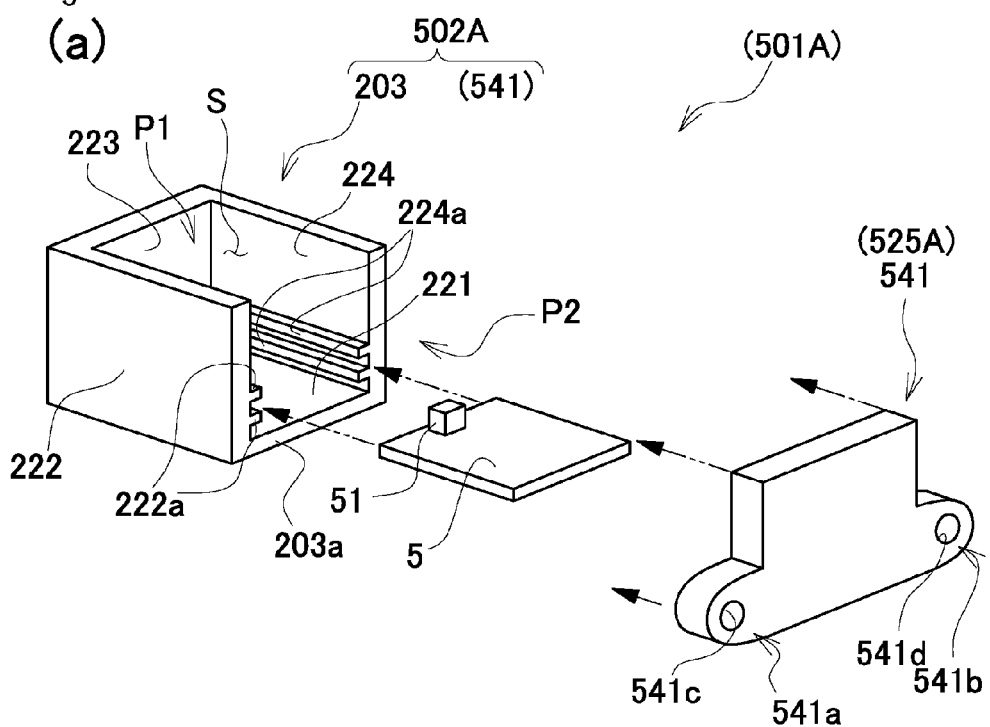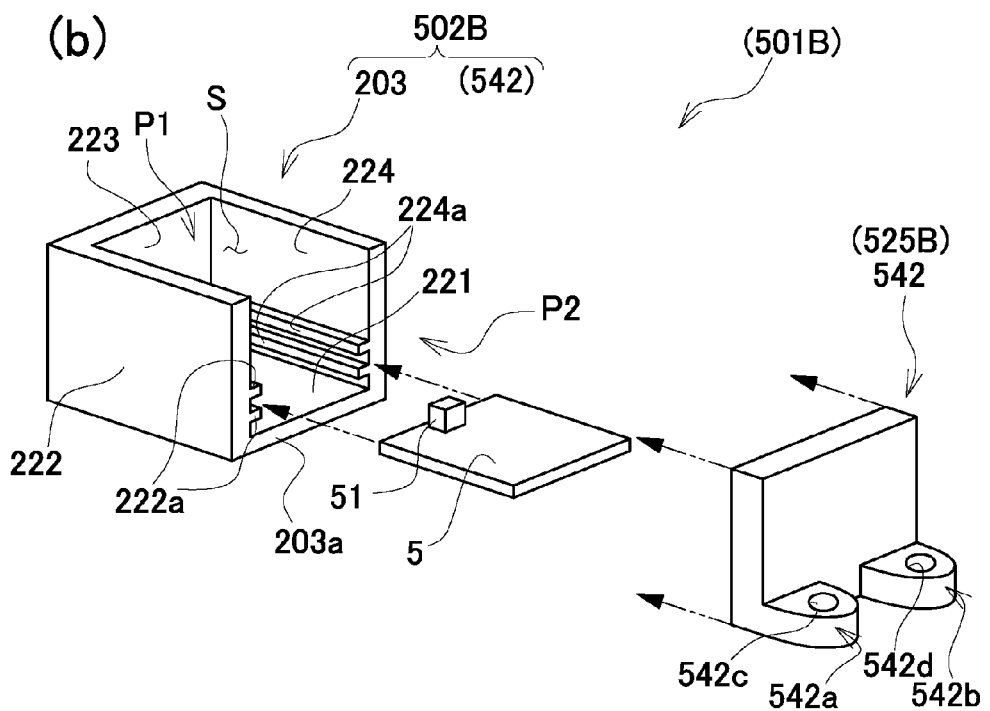

Fig.9
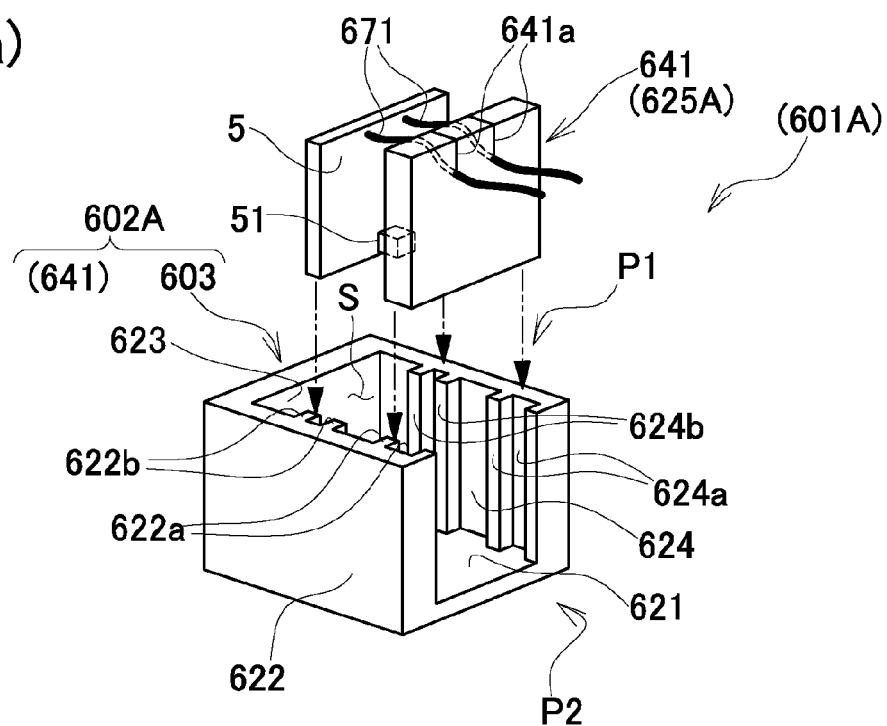
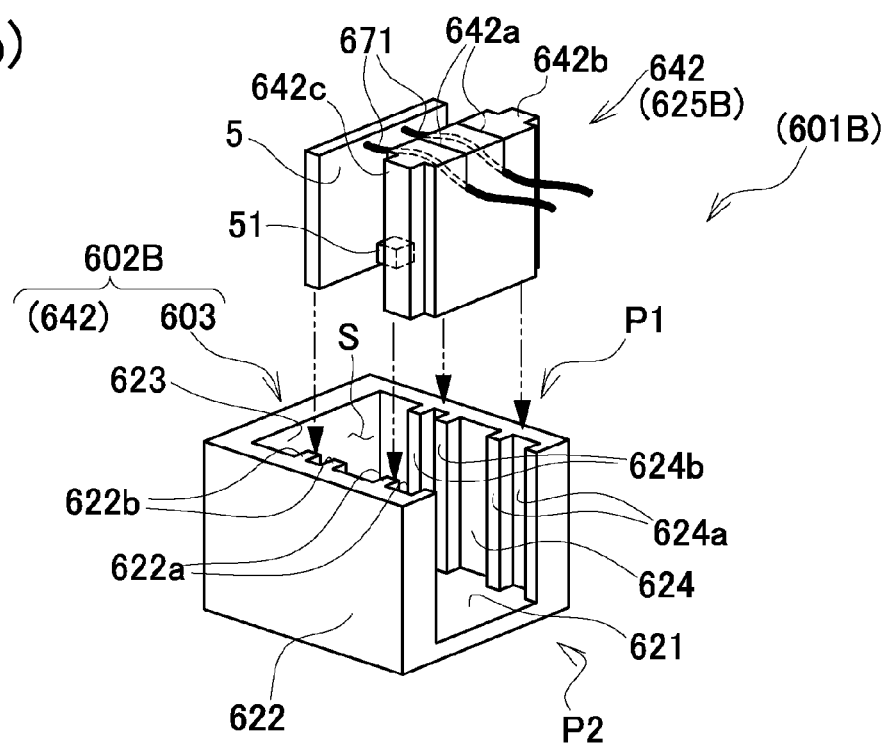

Fig. 10
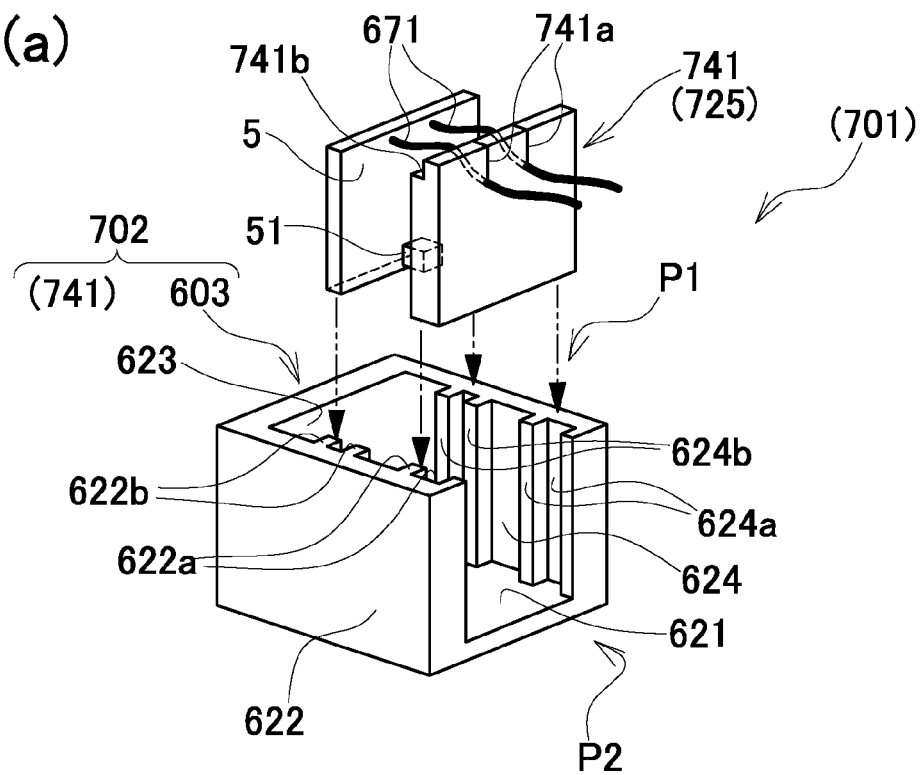
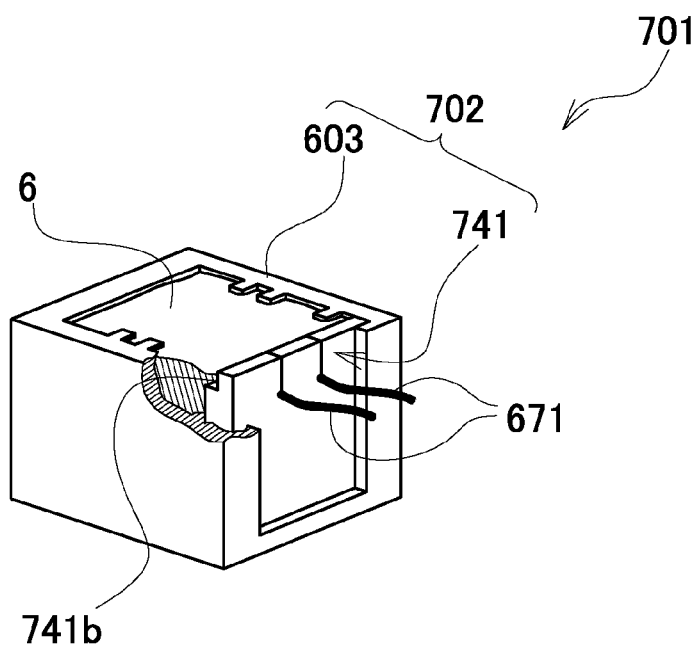

ELECTRONIC MODULE AND METHOD FOR MANUFACTURING ELECTRONIC MODULE

CROSS-REFERENCE TO RELATED APPLICATION

This application is a divisional of U.S. application Ser. No. 13/732,881, filed on Jan. 2, 2013, which claims the benefit of priority from the prior Japanese Patent Application No. 2012-115435, filed on May 21, 2012, the entire contents of which are incorporated herein by reference.

FIELD OF THE ART

This invention relates to an Electronic Module such as an integrated sensor wherein a substrate on which an electronic component is mounted is housed in a case and a method for manufacturing the Electronic Module.

BACKGROUND ART

Conventionally known are various Electronic Modules constituted as a sensor module such as an acceleration sensor or a slant sensor.

This Electronic Module is generally so configured that an electronic component having a sensor function is mounted on a substrate and a connecting part such as a terminal or a lead wire to give and receive an electric signal between the substrate and the outside. With a view to improve the convenience or the environment resistance at a time of using the Electronic Module, there is an Electronic Module that is used in a state that a substrate is housed in a box case (for example, refer to the patent document 1). For this type of the Electronic Module not only strength as a whole can be secured but also mounting operation can be facilitated by fixing a surface of the case on the outside.

Furthermore, for an Electronic Module without a case suggested is an Electronic Module that is so configured that a substrate is covered and protected by a resin having a low elastic modulus so as to improve the environment resistance such as impact resistance or resistance to vibration by placing the substrate in a mold so as to provide the substrate with resin mold (for example, refer to the patent document 2 and the patent document 3).

Meanwhile, a higher level is required in the environment resistance such as the impact resistance, the resistance to vibration and the water resistance in addition to the facilitation of the mounting operation in the market of an Electronic Module used by being mounted on a vehicle. In addition to this, furthermore price-reduction is requested.

In order to meet these requirements combining the Electronic Module using the case with the Electronic Module wherein the substrate is covered with the resin can be conceived.

For example, it can be conceived that a so-called boat-shaped case comprising a bottom wall and side walls standing from a circumference of the bottom wall and having an internal space where an opening part locates at an upper side is used and a substrate is housed in the internal space and a resin is filled into the internal space so as to seal the substrate. With this arrangement, the Electronic Module can be mounted with ease on the outside by making use of a surface of the case and the high environmental resistance can be comprised by sealing the substrate with the resin.

PRIOR ART DOCUMENT

Patent Document

Patent document 1: Japanese Unexamined Patent Application Publication Number 2001-214776
Patent document 2: Japanese Unexamined Patent Application Publication Number 2010-19693
Patent document 3: Japanese Unexamined Patent Application Publication Number 2010-164412

DISCLOSURE OF THE INVENTION

Problems to be Solved by the Invention

However, as mentioned above, in case of using the boat-shaped case and the substrate is housed inside of the boat-shaped case and the substrate and the case is integrated by the resin, a shape of the Electronic Module that can be manufactured might be limited.

For example, it is preferable to manufacture the boat-shaped case by resin molding in order to reduce a manufacturing cost, however, in manufacturing the case it can be conceived to conduct so-called insert molding with integrating a metal pin to give and receive an electrical signal between the substrate to be housed in the case and the outside. Then, in case that the substrate is housed in the case, it is necessary to electrically connect the metal pin and the substrate by means of a soldering or the like. In view of cost reduction, it is preferable that the metal pin is arranged in a state standing from the bottom wall. Then in order to connect the metal pin and the substrate, a shape to house the substrate is limited. In addition, in case of conducting an operation such as soldering, it is necessary to conduct the operation through an upper opening. Then a working efficiency is remarkably down depending on a position of the pin or a direction of the substrate. As a result, in order to reduce a cost by simplifying the manufacture process, there will be some limitations in the position to arrange the pin or the position and the direction to house the substrate.

In addition, in case that the electronic component to be mounted on the substrate has a directional property in detection such as a uniaxial acceleration sensor, the detecting direction as a sensor is also limited.

Furthermore, in case that the connecting part to give and receive the signal to and from the outside is formed by other than the pin, it becomes necessary to change a mold to mold the case, resulting in increase of the manufacturing cost. In order to solve this situation, it can be conceived that a lead wire to be connected with the substrate is drawn to the outside through the opening part locating on the upper side of the case, however, with this arrangement, since the position from which the lead wire is drawn is limited, a shape of the Electronic Module as a whole is limited.

Furthermore, in order to be tailored to an object to be mounted a variety of mounting parts to mount the Electronic Module on the outside having a variety of shapes can be conceived, however, in case of manufacturing the case of various patterns, it becomes necessary to prepare various different molds, resulting in cost increase.

The present claimed invention intends to solve the above-mentioned problem effectively, concretely an object of this invention is to provide a low cost Electronic Module that can be manufactured easily with a simple structure wherein a direction of the substrate housed inside, a connecting part to give or receive between the substrate and the outside or a part of the fixing part to mount the Electronic Module on the outside can be tailored to various different shape and a method for manufacturing the Electronic Module.

Means to Solve the Problems

In order to attain this object, the present claimed invention takes the following means.

More specifically, an Electronic Module of this invention comprises a body case that comprises a plurality of case members by making an abutting contact each other and that has an internal space where a first opening is formed on one side surface of the internal space and a second opening that opens in a direction different from that of the first opening is in an exposed state when a plurality of the case members are separated each other, a substrate on which an electronic component is mounted and that is housed in the internal space of the body case, and a resin body that covers the substrate by being filled into the internal space of the body case and solidified or hardened, and is characterized by that the plurality of case members and the substrate are integrated by the use of the resin body as an accouplement.

In accordance with this arrangement, it is possible to manufacture the sensor module that can improve a waterproof property and strength. In addition, it becomes possible to house the substrate in the internal space with high positioning accuracy by making use of the wide opening comprising the first opening and the second opening. In addition, it is also possible to improve a yield with restraining the air pockets at a time of filling the resin. Furthermore, since the work of housing or electrically connecting the substrate becomes easy, a freedom degree of a direction in mounting the substrate is increased. As a result, it becomes also possible to provide various modes having different specifications of the sensor modules with ease and at low cost by using the commonly used case members and the substrate.

In addition, in order to make it possible to provide various modes having different specification of the connecting part easily and at low cost since the connecting part to receive and give the electric signal can be tailored to the external device just by changing a part of the case members alone easily and at low cost and in order to improve a yield by making it more efficient to conduct a electrical connecting operation between the connecting part and the substrate housed inside, it is preferable that a connecting part to give and receive an electronic signal to and from the outside is arranged on at least one of the case members and the connecting part and the substrate are electrically connected.

In order to make it possible to manufacture Electronic Modules of variously different specifications such as a position or a direction of the fixing part that determines a mounting method for the external device at low cost just by changing a part of the case members alone, it is preferable that a fixing part to fix the body cases to the outside is arranged on at least one of the case members.

In order to make it possible both to facilitate assembling the body case and to conduct an operation of electrically connection by the use of the lead wire efficiently, it is preferable at least one of the case members is formed with an elastic material and the second opening is sealed by inserting the case member made of the elastic material into inside of the other case member.

In order to make it possible to constitute a stronger integrated configuration by restraining a movement of the case members being separated each other, it is preferable that a concave part in a direction crossing a direction in which the case members can be separated each other prior to filling the resin body is formed on an inner surface of at least one of the case members constituting a wall surface of the internal space in the body case A method for manufacturing an Electronic Module of this invention is characterized by including a step, wherein a body case that has an internal space on one surface of which a first opening is formed and that comprises a plurality of case members is in a state that a second opening that opens in a direction different from a first opening is in an exposed state by separating a plurality of the case members, to insert a substrate into the internal space of the body case, a step to seal the second opening by combining a plurality of the case members, a step to fill a resin body in a liquid state or in a softened state into the internal space through the first opening, and a step to solidify or harden the resin body.

In accordance with this arrangement, it is possible to manufacture the sensor module that can improve a waterproof property and strength. In addition, it becomes possible to house the substrate in the internal space with high positioning accuracy by making use of the wide opening comprising the first opening and the second opening. In addition, it is also possible to improve a yield with restraining the air pockets at a time of filling the resin. Furthermore, since the work of housing or electrically connecting the substrate becomes easy, a freedom degree of a direction in mounting the substrate is increased. As a result, it becomes also possible to provide various modes having different specifications of the sensor modules with ease and at low cost by using the commonly used case members and the substrate.

Effect of the Invention

In accordance with the above-mentioned present claimed invention, it is possible to provide the Electronic Module with improving water proof and strength, easy to manufacture and having various modes of different specification easily and at low cost by changing the direction of the substrate housed in the body case, the connecting part receiving or giving the electrical signal between the substrate and the outside or a part of the mounting part to mount the Electronic Module on the outside and the method for manufacturing the Electronic Module.

BRIEF DESCRIPTION OF THE DRAWINGS

FIGS. 2 (a) and (b) are explanatory views showing a manufacturing process of the Electronic Module.

FIGS. 5 (a) and (b) are explanatory views showing a manufacturing process of the Electronic Module in FIG. 4.

FIGS. 6 (a) and (b) are explanatory views showing a manufacturing process of an Electronic Module in accordance with a second embodiment of this invention.

FIGS. 7 (a) and (b) are explanatory views showing a manufacturing process of an Electronic Module in accordance with a third embodiment of this invention.

FIGS. 8 (a) and (b) are explanatory views showing a manufacturing process of an Electronic Module in accordance with a fourth embodiment of this invention.

FIGS. 9 (*a*) and (*b*) are explanatory views showing a manufacturing process of an Electronic Module in accordance with a fifth embodiment of this invention.

FIGS. 10 (*a*) and (*b*) are explanatory views showing a manufacturing process of an Electronic Module in accordance with a sixth embodiment of this invention.

BEST MODES OF EMBODYING THE INVENTION

One embodiment of this invention will be described with reference to drawings.

First Embodiment

Figure 1:
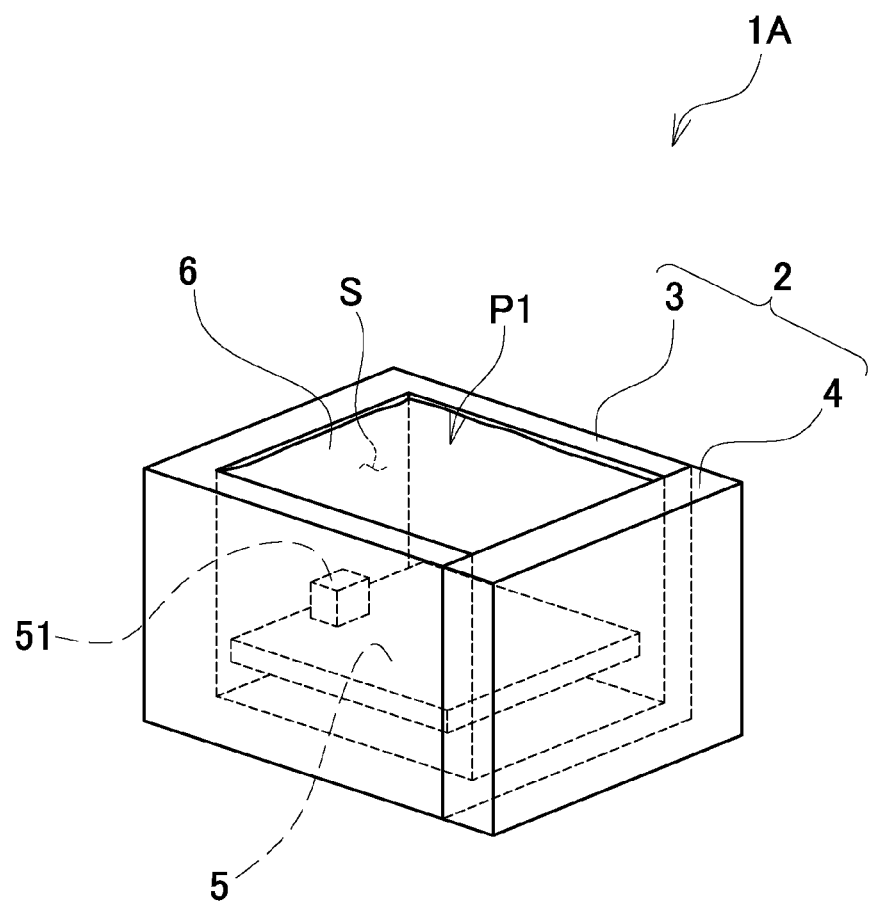
FIG. 1 is a perspective view of an Electronic Module in accordance with a first embodiment of this invention.

An Electronic Module of this embodiment is a uniaxial acceleration sensor module 1A (hereinafter referred to as a sensor module), and has a shape as shown in FIG. 1. FIG. 1 is a pattern diagram and a part electrically connecting with the outside to give and receive a signal is omitted to show.

The sensor module 1A is formed generally in a cuboid, and is filled with a resin body 6 in a state that a substrate 5 on which a sensor IC 51 as being an electronic component is mounted is housed inside of a boat-shaped body case 2 as being an outside part. With this arrangement, it is possible to cover the substrate 5 by the resin body 6 and to support the substrate 5 by the inside of the body case 2.

The body case 2 is formed in a cuboid. The body case 2 has an internal space (S) to house the substrate 5 and the resin body 6. A first opening P1 to open the space (S) to the outside is formed on an upper surface of the body case 2.

In an explanation of this embodiment, in case of explaining a direction such as a vertical direction, a lateral direction or a horizontal direction, a posture of the sensor module 1A that is arranged with its surface having an opening to fill the resin body 6 locating at a vertical upper side is set as the baseline. The same applies to the other embodiments to be described later.

The body case 2 comprises a first case member 3 as being a main part and a second case member 4 whose side surface makes an abutting contact with the first case member 3. In a state of no resin body 6, when the first case member 3 is separated from the second case member 4, a second opening P2 (refer to FIG. 2) that is continuous to the first opening P1 and that opens in a direction orthogonal to the first opening P1 is in an exposed state so that the internal space (S) opens wider.

The resin body 6 is solidified in the internal space (S) in a state of being filled into near the upper part of the body case 2, and covers whole of the substrate 5 including the sensor IC 51 and supports the substrate 5. With this arrangement, it is possible for the resin body 6 to protect the substrate 5 from water or oil. Furthermore, since the resin body 6 is filled into the inside of the body case 2, it is possible to improve the strength and to protect the substrate 5 from an external force or shock by means of the elasticity of the resin body 6 itself and to prevent the substrate 5 from being damaged. Furthermore, the resin body 6 works as an accouplement to couple the first case member 3, the second case member 4 and the substrate 5 so as to integrate whole of the sensor module 1A.

FIG. 2(*a*), (*b*) shows an outline of a manufacturing process of the sensor module 1A. In manufacturing the sensor module 1A, the first case member 3, the second case member 4 and the substrate 5 are formed first respectively.

The first case member 3 is formed in generally a cuboid as mentioned above, and the cuboid internal space (S) is formed inside of the first case member 3. An upper part of the internal space (S) opens due to the above-mentioned first opening P1, and a side that makes an abutting contact with the second case member 4 opens due to the second opening P2. In other words, the first case 3 comprises a rectangular bottom wall 21, and continuously arranged rectangular side walls 22~24 standing from three sides of the rectangular bottom wall 21.

The second case member 4 is in a rectangular shape generally the same as a shape of the side wall 23. The second case member 4 makes an abutting contact with an abutting surface 3a, as being an end surface locating in the second opening P2 side, of the first case member 3 and the second case member 3 functions as a forth side wall 25 so that the second opening P2 is sealed. Then the boat-shaped body case 2 whose internal space (S) opens only by the first opening P1 as shown in FIG. 2(*b*) can be constituted by the second case member 4 together with the first case member 3.

The first case member 3 and the second case member 4 are manufactured by molding a resin, and a plurality of metal pins (not shown in drawings) are arranged on the bottom wall 21 of the first case member 3 in a direction orthogonal to the bottom wall 21. This arrangement makes it possible to give and receive an electrical signal between the internal space (S) and the outside by making use of the metal pins as a connecting part.

The substrate 5 is formed as a print substrate having an electrical circuit on its surface, and is in a state that the sensor IC 51 is connected to a part of the substrate 5. The sensor IC 51 can detect acceleration in a uniaxial direction. In a state of being mounted on the substrate 5 the sensor IC 51 can detect the acceleration of a horizontal direction to the substrate 5.

As mentioned, the sensor module 1A is manufactured by the use of the components after each component is manufactured.

Hereinafter, an explanation will be made based on a flow chart as being a part of the manufacturing process of the sensor module 1A shown in FIG. 3 with reference to FIG. 2(*a*), (*b*).

First, the substrate 5 is inserted into the inside of the first case member 3 as a first step (ST1). At this time, the substrate 5 is housed in the internal space (S) through the second opening P2 in a state that the substrate 5 is in parallel to the bottom wall 21 of the first case member 3. If spacers (not shown in drawings) are provided at four corners of the bottom surface of the substrate 5, it is possible to position the substrate 5 in a state that most part of the substrate 5 floats in the internal space (S). Since the internal space (S) opens also in the second opening P2 in addition to the first opening P1, an operation of housing the substrate 5 in the internal space (S) can be conducted efficiently and the positioning of the substrate 5 can be conducted with high accuracy by making use of the wide openings P1 and P2.

The substrate 5 and the metal pin are electrically connected as the second step (ST2). Concretely, the substrate 5 including the sensor IC 51 can give and receive an electrical signal to and from the outside through the metal pin by electrically connecting a part of the electrical circuit formed on the surface of the substrate 5 and the metal pin by means of a conducting wire or soldering. Since the internal space (S) opens not only in the first opening P1 but also in the second opening P2, the operation can be conducted from various directions by making use of the wide openings P1 and P2 so that it is possible to conduct the operation efficiently.

Next, the first case member 3 and the second case member 4 are combined in a state of making an abutting contact each other so that the body case 2 of a shape wherein the side walls 22~25 stand from four sides of the bottom wall 21 is composed as the third step (ST3). With this step, the second opening P2 that is in an exposed state at a time when the second case member 4 is separated from the first case member 3 is sealed, and the internal space (S) becomes in an open state through the first opening P1 alone. Since both the abutting surface 3a formed on the first case member 3 and the surface of the second case member 4 are formed in a planar state, almost no gap will be produced at a time when the first case member 3 makes an abutting contact with the second case member 4. In addition, a relationship of a size is so set that the substrate 5 is smaller than the internal space (S) in a plane view at a stage that the body case 2 is composed. Concretely, since a width of the substrate 5 in the abutting direction of the second case member 4 is set to be smaller than that of the internal space (S) so as to generate a gap between the inner surface of the side wall 23 and the inner surface of the side wall 25 when combined, the internal space (S) is in a state of being in communication vertically without being shielded by the substrate 5.

The resin body 6 in a liquid state is filled into the internal space (S) of the body case 2 comprising the first case member 3 and the second case member 4 as a fourth step (ST4). A thermosetting epoxy resin that is in a liquid state at an initial stage is used as the resin body 6. The resin body 6 is filled into the internal space (S) from the first opening P1 as shown by an arrow (R) in FIG. 2(b). With this procedure, the resin body 6 pervades until near the upper part of the internal space (S) so that the whole of the substrate 5 including the sensor IC 51 is covered by the resin body 6. At this time, it is necessary to apply a pressure to the first case member 3 and the second case member 4 in a direction to abut the first case member 3 and the second case member 4 each other so as not to generate a gap between the first case member 3 and the second case member 4 due to a pressure from the filled resin body 6. In addition, it is also necessary to adjust a viscosity of the resin body 6 so as not to leak out the resin body 6 from a gap between the first case member 3 and the second case member 4. Furthermore, as mentioned since the substrate 5 is formed smaller than the internal space (S) in plane view so that the internal space (S) is in communication vertically and the substrate 5 is positioned with high accuracy by making use of the wide opening, it becomes possible to fill the resin body 6 evenly without generating air pockets over the space from a circumference of the substrate 5 to the back side of the substrate 5.

Finally, the filled resin body 6 is solidified as the fifth step (ST5). Concretely, since the thermosetting epoxy resin is used as the resin body 6, the resin body 6 is put into a constant temperature oven so as to raise the temperature of the resin body 6 and solidify the resin body 6. When the resin body 6 is hardened, the resin body 6 acts as the accouplement to couple the first case member 3 and the second case member 4. Then the first case member 3 and the second case member 4 will not be separated even though the pressure applied to the first case member 3 and the second case member 4 in the abutting direction. The sensor module 1A is completed when the resin body 6 is solidified.

With this arrangement, it is possible to integrate the first case member 3, the second case member 4 and the substrate 5 into the sensor module 1A by coupling the first case member 3, the second case member 4 and the substrate 5 with the resin body 6 as the accouplement, and to protect the substrate 5 by the resin body 6.

In addition, it is also possible to use other kind of the resin as the resin body 6. For example, in case of using a thermoplastic resin, the thermoplastic resin body 6 is filled into the internal space (S) in a softened state by applying heat and then hardened by cooling down. As a result, it is possible to constitute the sensor module 1A similar to the above-mentioned arrangement.

Figure 4:
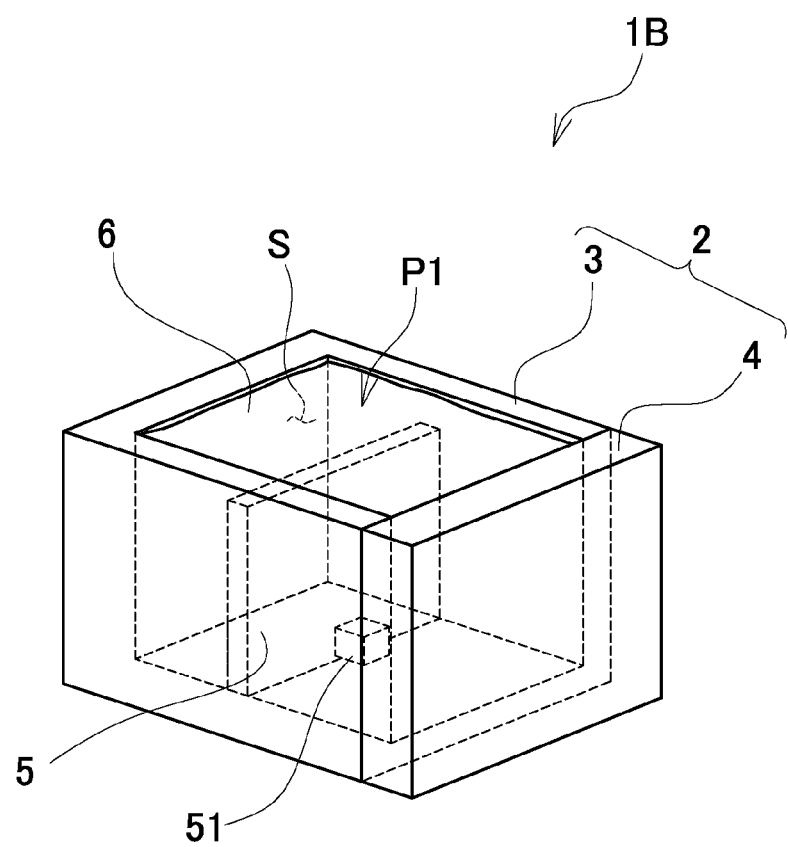
FIG. 4 is a perspective view showing a variation of the Electronic Module and of the Electronic Module manufactured by changing a direction of a substrate.

It is also possible for the sensor module 1A having the above-mentioned arrangement to constitute a sensor module 1B as shown in FIG. 4 by using the same components.

The sensor module 1B is made by housing the substrate 5 in an upright state into the internal space (S) of the body case 2 formed by abutting the first case member 3 and the second case member 4 each other and then the resin body 6 is filled into the internal space (S). With this arrangement, since a direction of the sensor IC 51 mounted on the substrate 5 can be changed although the same substrate 5 is used, it is possible to change a direction of detecting the acceleration. As a result, although appearance of the sensor module 1B is the same as that of the sensor module 1A shown in FIG. 1, since the substrate 5 is arranged as shown in FIG. 2, it is possible to obtain the sensor module 1B whose detection direction varies.

A process of manufacturing the sensor module 1B is the same as that of the above-mentioned sensor module 1A.

As shown in FIG. 5(a), in a state that the first case member 3 is separated from the second case member 4, the substrate 5 is housed in the internal space (S) in an upright posture. At this time, a spacer for positioning the substrate 5 may be appropriately used. Since the substrate 5 is so set to reach a position lower than the upper surface of the body case 2 in the upright posture, it is possible to cover the substrate 5 by the resin body 6 completely.

As mentioned, in a state that the substrate 5 is housed in the internal space (S), the metal pin (not shown in drawings) arranged on the bottom wall 21 of the first case member 3 and the substrate 5 are electrically connected by means of soldering or the like. At this time, since the second opening P2 is in an exposed state in addition to the first opening P1, it is possible to conduct an operation of electrically connecting the metal pin and the substrate 5 efficiently. On the contrary, in case of using a conventional case comprising a single piece of a component wherein four sides are covered by wall surfaces, in order to arrange the substrate 5 in the upright posture inside of the internal space (S), the assembling efficiency is extremely down and it is difficult to manufacture the sensor module stably.

The body case 2 is comprised in a state that the first case member 3 makes an abutting contact with the second case member 4 and then the liquid resin body 6 is filled in the internal space (S) as shown by an arrow (R) in FIG. 5(b) through the first opening P1. In this case, since both a space locating in a front side (the sensor IC side) of the substrate 5 and a space locating in a back side (opposite side to the sensor IC) of the substrate 5 are open by the first opening P1 because the substrate 5 is housed in the upright posture, the resin body 6 easily prevails evenly in the front side and the back side of the substrate 5. As a result, it is possible to fill the resin body 6 appropriately without generating voids resulting from air pockets.

If the resin body 6 is hardened by applying heat and then cooled down, it is possible to obtain the sensor module 1B that can detect the acceleration in a different direction although the sensor module 1B is the same in appearance as the sensor module 1A (refer to FIG. 1). Since the sensor module 1A (refer to FIG. 1) and the sensor module 1B (refer to FIG. 4) constitute a variation group wherein a sensor detecting direction varies while the sensor module 1A and the sensor module 1B use the same components, it is possible to provide a sensor module with high convenience and at low cost.

As mentioned above, the sensor module 1A, 1B comprises the body case 2 that comprises a plurality of case members 3, 4 by making an abutting contact each other and has the internal space (S) whose first opening P1 is formed on one side surface and the second opening P2 that opens in a direction different from that of the first opening P1 is exposed by separating the multiple case members 3, 4, the substrate 5 on which the sensor IC 51 is mounted and that is housed in the internal space (S) of the body case 2, and the resin body 6 that covers the substrate 5 by being filled into the internal space (S) of the body case 2 and solidified or hardened, and it is so configured that multiple case members 3, 4 and the substrate 5 are integrated by the use of the resin body 6 as an accouplement.

In accordance with this arrangement, it is possible to manufacture the sensor module 1A, 1B that can improve a waterproof property and strength by covering the substrate 5 with the resin body 6. In addition, it becomes possible to house the substrate 5 in the internal space (S) with high positioning accuracy by making use of wide opening comprising the first opening P1 and the second opening P2. In addition, it is also possible to improve a yield with restraining the air pockets by filling the resin body 6 evenly, thereby reducing a manufacturing cost. Furthermore, since the operation of housing or electrically connecting the substrate 5 becomes easy, a freedom degree of a direction in mounting the substrate 5 is increased. As a result, it becomes also possible to develop variations of the sensor module 1A, 1B by using the commonly used case member 3, 4 and the substrate 5 with ease and at low cost. Furthermore, in case of viewing this embodiment as a manufacturing method of the sensor module 1A, 1B, the manufacturing method of the sensor module 1A, 1B includes the step (ST1) to insert the substrate 5 into the internal space (S) of the body case 2 on one surface of which the first opening P1 is formed and that comprises a plurality of the case members 3, 4 in a state that a second opening P2 that opens in the direction different from the first opening P1 is in an exposed state by separating a plurality of the case members 2, 3, the step (ST3) to seal the second opening P2 by combining a plurality of the case members 3, 4, the step (ST4) to fill the resin body 6 in a liquid state or in a softened state into the internal space (S) through the first opening P1, and the step (ST5) to solidify or harden the resin body 6.

As mentioned, from a standpoint of the manufacturing method, since the above-mentioned steps are included, it is possible to manufacture the sensor module 1A, 1B that can improve a waterproof property and strength by covering the substrate 5 with the resin body 6. In addition, it becomes possible to house the substrate 5 in the internal space (S) with high positioning accuracy by making use of the wide opening comprising the first opening P1 and the second opening P2. In addition, it is also possible to improve a yield with restraining the air pockets by filling the resin body 6 evenly, thereby reducing a manufacturing cost. Furthermore, since the work of housing or electrically connecting the substrate 5 becomes easy, a freedom degree of a direction in mounting the substrate 5 is increased. As a result, it becomes also possible to provide various modes having different specifications of the sensor modules 1A, 1B with ease and at low cost by using the commonly used case members 3, 4 and the substrate 5.

Second Embodiment

FIG. 6(a) shows a sensor module 201 of the second embodiment. FIG. 6(a) corresponds to FIG. 2(a), and shows a process of manufacturing the sensor module 201. In FIG. 6, the same parts as those in the first embodiment are denoted by the same reference numerals as those in the embodiment, and descriptions thereof will be omitted.

Figure 3:
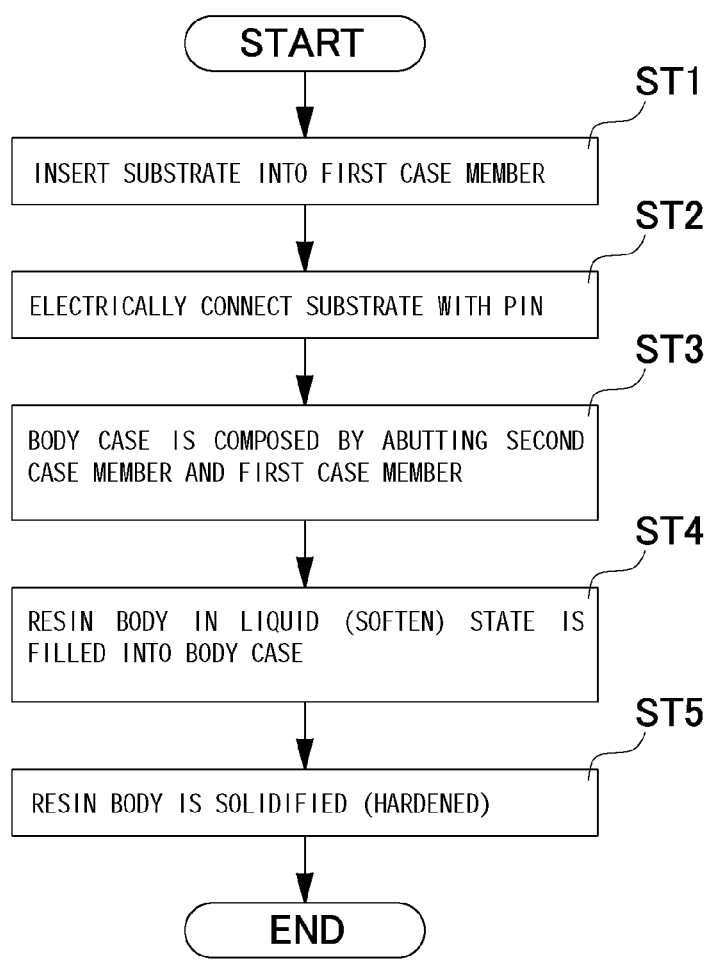
FIG. 3 is a flow chart showing a manufacturing process of the Electronic Module.

Similar to the sensor module 1A, 1B (refer to FIG. 1 and FIG. 4) in the first embodiment, the sensor module 201 in this embodiment is manufactured by the method explained by the use of FIG. 3. In this case also, the body case 202 having the internal space (S) that houses the substrate 5 comprises the first case member 203 and the second case member 204. In a state that the first case member 203 and the second case member 204 are combined in a state of an abutting contact each other, the internal space (S) opens by the first upper opening P1 alone. However, in a state that the first case member 203 is separated from the second case member 204, the internal space (S) opens also by the second opening P2 locating in the side direction in addition to the first opening P1.

The substrate 5 on which the sensor IC 51 is mounted is housed in the internal space (S) in a state that the first case member 203 is separated from the second case 204.

In this embodiment, a shape of the first case member 203 is largely different from the first case member 3 in the first embodiment. The first case member 203 comprises a rectangular bottom wall 221, and side walls 222~224 standing from three sides of the bottom wall 221 and each of them are continuously formed. A pair of convex guide parts 222a, 222a are provided on the side wall 222 and a pair of convex guide parts 224a, 224a are provided on the side wall 224 facing the side wall 222. The convex guide parts 222a, 222a (224a, 224a) extend along the side wall 222 (224) in parallel to the bottom wall 221 and in pairs in the vertical direction and form a gap a little wider than a thickness of the substrate 5 between a pair of the convex guide parts 222a, 222a (224a, 224a) formed on the side wall 222 (224). Furthermore, in viewing the side walls 222, 224 facing each other, the convex guide parts 222a formed on the side wall 222 and the convex guide parts 224a formed on the side wall 224 are also in a positional relationship of facing each other.

The convex guide parts 222a, 224a may be formed together with the first case member 203 as a whole of a resin, or may be formed by being fixed on the flat-shaped inner surface of the side wall 222, 224 by means of adhesive or the like.

In case of housing the substrate 5 in the internal space (S) of the first case member 203, each opposed side of the substrate 5 is inserted into the gap between the convex guide parts 222a, 222a and the gap between the convex guide parts 224a, 224a respectively. With this procedure, it is possible to position the substrate 5 easily and accurately without any spacer in the internal space (S).

Since the object of the convex guide parts 222a, 224a is to position the substrate 5, it is not indispensable to form the convex guide parts 222a, 224a as mentioned above. Then in order to insert the opposed sides of the substrate 5, concave grooves may be formed on the inner surface of the side wall 222, 224.

After housing the substrate 5 in the internal space (S), the substrate 5 is electrically connected with the metal pin (not shown in drawings) arranged on either of the bottom wall 221 or the side wall 222~224 of the first case member 203, and then the second case member 204 makes an abutting contact with an abutting surface 203a of the first case member 203 so as to combine the first case member 203 and the second case member 204 by making use of the second case member 204 as a forth side wall 225 and the resin body 6 (refer to FIG. 1) is filled in the internal space (S) and then the resin body 6 is hardened.

Even though the above-mentioned arrangement, it is possible to obtain the same effect as that of the first embodiment.

In addition, the above-mentioned arrangement may be modified as shown in FIG. 6(b) so as to configure the sensor module 301. In this case, the body case 302 comprises the first case member 303 and the second case member 204. The first case member 303 comprises a bottom wall 321, and side walls 322~324 standing from three sides of the bottom wall 321 and each of them are continuously formed. Convex guide parts 322a, 322a, 322b, 322b are provided on the side wall 322 and convex guide parts 324a, 324a, 324b, 324b are provided on the side wall 324 facing the side wall 322. The convex guide parts 322a, 322a (324a, 324a) extend along the side wall 322 (324) in parallel to the bottom wall 321 and form a gap a little wider than a thickness of the substrate 5 between a pair of the convex guide parts 322a, 322a (324a, 324a) formed on the side wall 322 (324). In addition, the convex guide parts 322b, 322b (324b, 324b) extend along the side wall 322 (324) and orthogonal to the bottom wall 321 and in pairs in the horizontal direction and form a gap a little wider than a thickness of the substrate 5 between a pair of the convex guide parts 322b, 322b (324b, 324b) formed on the side wall 322 (324).

The convex guide parts 322a, 322b, 324a, 324b may be formed together with the first case member 303 as a whole of a resin, or may be formed by fixing other member by means of adhesive or the like. Instead of the gap formed by the convex guide part 322a, 322b, 324a, 324b, the gap may be formed as concave grooves by means of a machine processing.

In case of using the first case member 303, it is possible to house the substrate 5 in the internal space (S) either in a horizontal state or in a vertically upright state. For example, in case of housing the substrate 5 in a horizontal posture, the opposed sides of the substrate 5 are inserted into the gap between the convex guide parts 322a, 322a formed in pairs in the vertical direction on the side wall 322 and the gap between the convex guide parts 324a, 324a formed in pairs in the vertical direction on the side wall 324. In addition, in case of housing the substrate 5 in a vertically upright posture, the opposed sides of the substrate 5 are inserted into the gap between the convex guide parts 322b, 322b formed in pairs in the direction of abutting the first case member 303 and the second case member 404 on the side wall 322 and the gap between the convex guide parts 324b, 324b formed in pairs in the abutting direction on the side wall 324.

With this arrangement, it is possible both to position the substrate 5 easily and accurately in the internal space (S) without using any spacer and to constitute multiple modes of sensor module 301 that can select the positioning of the direction of the substrate 5 easily by using the same component.

The following manufacturing process is the same as that of the first embodiment. As a result, also in case of this modified embodiment, it is possible to obtain the same effect as that of the first embodiment.

Third Embodiment

FIG. 7(a) shows a sensor module 401A of the third embodiment. FIG. 7(a) corresponds to FIG. 2(a), and shows a process of manufacturing the sensor module 401A. In FIG. 7, the same parts as those in the first embodiment and the second embodiment are denoted by the same reference numerals as those in the embodiment, and descriptions thereof will be omitted.

Similar to the sensor module 1A, 1B (refer to FIG. 1 and FIG. 4) in the first embodiment, the sensor module 401A in this embodiment is manufactured by the method explained by the use of FIG. 3. In this case also, the body case 402A having the internal space (S) that houses the substrate 5 comprises the first case member 403 and the second case member 441. In a state that the first case member 403 and the second case member 441 are combined in a state of making an abutting contact each other, the internal space (S) opens by the first upper opening P1 alone. However, in a state that the first case member 403 is separated from the second case member 441, the internal space (S) opens also by the second opening P2 locating in the side direction in addition to the first opening P1.

The first case member 403 comprises a rectangular bottom wall 421 and side walls 422~424 standing from three sides of the bottom wall 421 and each of them are continuously formed. Convex guide parts 422a, 422b, 424a, 424b are provided on the side walls 422, 424 facing each other among the side walls 422, 423, 424. The convex guide parts 422a, 422b, 424a, 424b extend along each side walls 422, 424 and vertically to the bottom wall 421. The convex guide parts 422a, 422b, 424a, 424b are formed of resin integrally with whole of the first case member 403, however, they may be formed by adhering a separated member on an inner surface of the side walls 442, 424.

Each of the convex guide parts 422a and 422a, 424a and 424a arranged near the second opening P2 among the convex guide parts 422a, 422a, 422b, 422b, 424a, 424a, 424b and 424b are formed in pairs in the horizontal direction respectively from the top end to the bottom end of the side wall 422, 424 so as to form a gap a little wider than a thickness of the second case member 441.

In addition, other convex guide parts 422b and 422b, 424b and 424b that are arranged separately from the convex guide parts 422a and 422a, 424a and 424a by a predetermined distance and a little to the center in the internal space (S) are formed in pairs in the horizontal direction from the top end to the bottom end of the side wall 422, 424 so as to form a gap a little wider than a thickness of the substrate 5.

When the second case member 441 is inserted from the upside into the gap formed by the convex guide parts 422a and 422a and the gap formed by the convex guide parts 424a and 424a, the second case member 441 serves as a side wall 425A so as to seal the second opening P2 and then the body case 402A is formed. A size of the second case member 411 is so set that the side wall 425A is of the same height as that of the other side walls 422~424. On the contrary, a size of the substrate 5 is so set that the upper part of the substrate 5 locates at a position lower than the height of the side walls 422~424, 425A at a time when the substrate 5 is inserted into the gap between the convex guide parts 422b and 422b and the gap between the convex guide parts 424b and 424b, and whose of the substrate 5 is covered by the resin body 6 (refer to FIG. 1) when the resin body 6 is filled into the internal space (S).

The second case member 441 is made of a resin body 6 by an insert molding, and metal pins 471, 471 are arranged in a state of penetrating from the front to the back of the second case member 441 near an upper part of the second case member 441 when the second case member 441 constitutes the body case 402A. The metal pins 471, 471 serve as a connecting part to give and receive an electrical signal between the substrate 5 housed in the internal space (S) and the outside in case that the sensor module 401A is comprised. Instead of the insert molding, the second case member 441 may be formed just in a plane shape and through bores are formed on the plane shape with drilling and the metal pins 471, 471 are inserted into the through bores.

FIG. 7(a) shows a state prior to assembling the second case member 441, the substrate 5 and the first case member 403, and in this stage the metal pins 471, 471 arranged on the second case member 441 as the connecting part are electrically connected with the substrate 5 by conductive wires or by means of soldering or the like. Since these operations are conducted not in a state that the substrate 5 is housed in the internal space (S) but in a state that a circumference of the substrate 5 is open, it is possible to conduct the operation of electrically connecting the metal pins 471 and the substrate 5 efficiently, resulting in improving a yield and reducing a period of time to manufacture the sensor module 401A.

As mentioned, the second case member 441 and the substrate 5 each of which is electrically connected are combined with the first case member 403 so as to comprise the body case 402A and the substrate 5 in a state of being electrically connected is housed in the internal space (S). Later, similar to the above-mentioned first and second embodiments, it is possible to obtain the integrated sensor module 401A by filling the resin body 6 in a liquid state (refer to FIG. 1) into the internal space (S) through the first opening P1 and then solidifying the resin body 6.

In filling the liquid resin body 6 into the internal space (S), since the second case member 441 is in a state of being supported by the convex guide parts 422a, 424a arranged on the first case member 403, it is possible to keep a shape of the body case 402A without applying a pressure from the outside so that an operation can be conducted more easily.

In addition, in case of the above-mentioned arrangement, it is possible to constitute the sensor module 402B having a different shape of a connecting part easily by changing the second case member 442 alone as shown in FIG. 7(b) while using the same components as the first case member 403 and the substrate 5 shown in FIG. 7(a).

In this case, the connecting part is formed as a connector 473 and the metal pins 472, 472 as a part of the connector 473 are in communication with a back side of the substrate 5. The connector 473 may be integrally formed with the second case member 442, however, it may be formed by mounting a separated component such as a marketed production. Also with this arrangement, the metal pins 472, 472 as a part of the connector 473 as being the connecting part arranged on the second case member 442 are electrically connected with the substrate 5 by conductive wires or by means of soldering or the like. Since these operations are conducted not in a state that the substrate 5 is housed in the internal space (S) but in a state that a circumference of the substrate 5 is open, it is possible to conduct the operation of electrically connecting the metal pins 472 and the substrate 5 efficiently, resulting in improving a yield and reducing a period of time to manufacture the sensor module 401B.

As mentioned, the second case member 442 and the substrate 5 in a state of being electrically connected are assembled with the first case member 403. Then, it is possible to constitute the body case 402B together with the first case member 403 with the second case member 442 as a new side wall 425B, and to make a state wherein the substrate 5 with which the electrically connection has been already provided is housed in the internal space (S). Then, it is possible to obtain the integrated sensor module 401B by filling the resin body 6 in a liquid state (refer to FIG. 1) into the internal space (S) and then solidifying the resin body 6.

As mentioned, it is possible to constitute various sensor modules having variously different connecting part tailored to the external device with ease and at a low cost just by replacing the second case member 442 alone that has a relatively small simple shape and that can be manufactured easily.

With the above-mentioned arrangement, it is possible to obtain the same effect as that of the first embodiment and the second embodiment.

Furthermore, the sensor module 401A, 401B of this embodiment is so configured that the connecting part 471 (473) to give and receive the electrical signal to and from the outside is provided for at least one of the case members 403, 441 (442) and the connecting part 471 (473) and the substrate 5 are electrically connected.

With this arrangement, it is possible to provide various modes having different specifications of the sensor modules 401A, 401B wherein a shape of a connector or a shape of the metal pin of the connecting part 471, 473 for giving and receiving the electrical signal to and from the outside is changed according to an external device easily and at low cost just by changing a part of the case member 441, 442 alone while most components are commonly used. In addition, since the operation of electrically connecting the connecting parts 471, 473 and the substrate 5 can be conducted in advance in an open space other than the internal space (S), it is possible to improve the efficiency of operation and to reduce the manufacturing cost due to improvement of the yield.

Fourth Embodiment

FIG. 8(a) shows a sensor module 501A of the fourth embodiment. FIG. 8(a) corresponds to FIG. 2(a), and shows a process of manufacturing the sensor module 501A. In FIG. 8, the same parts as those in the first~third embodiments are denoted by the same reference numerals as those in the embodiment, and descriptions thereof will be omitted.

The sensor module 501A of this embodiment is the same as the sensor module 201 in the second embodiment with changing the second case member 541 alone.

The second case member 541 serves as a side wall 525A by making an abutting contact with the abutting surface 203a of the first case member 203 so as to constitute the body case 502A together with the first case member 203. The procedure of housing the substrate 5 into the internal space (S) and filling and hardening the resin body 6 (refer to FIG. 1) is the same as the above-mentioned embodiments.

A shape of the second case member 541 is a rectangular plate with semielliptic convex parts 541a, 541b each of which is flush with the surface constituting the rectangular plate with extending outward from the side wall 222, 224 when assembled. The semielliptic convex part 541a, 541b comprises a through bore 541c, 541d respectively. When the second case member 541 is integrated as the sensor module 501A, the through bore 541c, 541d serves as a fixing part to mount the body case 502A on an external device by the use of a screw or the like. In case of mounting the sensor module 501A by making use of this fixing part, the side wall 525A side of the sensor module 501A faces a mounting surface of the external device.

Furthermore, instead of the second case member 541 shown in FIG. 8(a), it is possible to use the second case member 542 shown in FIG. 8(b). In this case also, the second case member 542 serves as the side wall 525B and constitutes the body case 502B together with the first case member 203. Then the substrate 5 is housed in the internal space (S) and the resin body 6 (refer to FIG. 1) is filled into the internal space (S) and hardened so that the sensor module 501B is comprised.

A shape of the second case member 542 is a rectangular plate with semielliptic convex parts 542a, 542b each of which extends from a position near an end part to the side wall 222, 224 and is flush with a bottom surface of the bottom wall 221 when assembled. The semielliptic convex part 542a, 542b comprises a through bore 542c, 542d respectively. When the second case member 542 is integrated as the sensor module 501B, the through bore 542c, 542d serves as a fixing part to mount the body case 502B on an external device by the use of a screw or the like. In case of mounting the sensor module 501B by making use of this fixing part, the bottom wall 221 side of the sensor module 501B faces a mounting surface of the external device.

As shown in FIG. 8(a), (b), the fixing part can be changed just by changing the second case member 541, 542 so that a mode of mounting the sensor module 501A, 501B on the external device can be changed easily, and various fixing parts can be comprised easily.

With the above-mentioned arrangement, it is also possible to obtain the same effect as that of the first embodiment and the second embodiment.

Furthermore, since the sensor module 501B is so configured that the fixing parts 541a, 541b (542a, 542b) for fixing the body case 502A (502B) to the external device is arranged at least one of the case members 203, 541 (542), it becomes possible to produce various modes having different specifications of the sensor modules 501A, 501B wherein a position or a direction of the fixing part 541 (542) is changed to whole of the body case 502A (502B) with ease and at low cost just by changing a part of the case member 541 (542) alone while most components can be commonly used.

Fifth Embodiment

FIG. 9(a) shows a sensor module 601A of the fifth embodiment. FIG. 9(a) corresponds to FIG. 2(a), and shows a process of manufacturing the sensor module 601A. In FIG. 9, the same parts as those in the first embodiment~the fourth embodiment are denoted by the same reference numerals as those in the embodiment, and descriptions thereof will be omitted.

The sensor module 601A in this embodiment is so configured that the body case 602A having the internal space (S) that houses the substrate 5 comprises the first case member 603 and the second case member 641. In a state that the body case 602A comprises the first case member 603 assembled with the second case member 641, the internal space (S) opens by the first opening P1 locating on the upper side alone. However, in a state that the first case member 603 is separated from the second case member 641, the internal space (S) opens also by the second opening P2 locating in the side in addition to the first opening P1.

The first case member 603 comprises a rectangular bottom wall 621, and continuously arranged side walls 622~624 standing from the sides of the bottom wall 621. Convex guide parts 622a, 622b, 624a, 624b are arranged on the side walls 622, 624 facing each other among the side walls 622~624. These convex guide parts 622a, 622b, 624a, 624b are formed both vertically to the bottom wall 621 and extending along the side walls 622, 624. These convex guide parts 622a, 622b, 624a, 624b are integrally formed of resin with whole of the first case member 603, however, they may be formed by other method such as adhering separated members to the inner surface of the side walls 622, 624.

The convex guide parts 622a and 622a, and 624a and 624a arranged near the second opening P2 are formed in pairs in the horizontal direction from the top end to the bottom end and form a gap a little wider than a thickness of the second case member 641. In addition, the other convex guide parts 622b and 622b, 624b and 624b that are arranged separately from the convex guide parts 622a and 622a, 624a and 624a by a predetermined distance and a little to the center in the internal space (S) are formed in pairs in the horizontal direction from the top end to the bottom end so as to form a gap a little wider than a thickness of the substrate 5.

The second case member 641 is made of an elastic material such as rubber or silicon. The second case member 641 is inserted into the first case member 603, concretely the second case member 641 is inserted from the upside into each gap formed by the convex parts 622a and 622a, 624a and 624a, so as to be a side wall 625A. The second case member 641 as being the side wall 625A tightly seals the second opening P2. Then the body case 602A is comprised by assembling the first case member 603 and the second case member 641. A size of the second case member 641 is so set to be the same height as that of the other side walls 622~624. On the contrary, a size of the substrate 5 is so set that a top part of the substrate 5 locates at a height lower than each top part of the side walls 622~624, 625A when the substrate 5 is inserted into each gap formed by the convex guide parts 622b and 622b, 624b and 624b respectively, and whole of the substrate 5 is covered by the resin body 6 when the resin body 6 is filled in the internal space (S).

As mentioned above, the second case member 641 is made of the elastic material and two slits 641a, 641a are arranged in parallel from the upper end part to a little lower part of the upper end part of the second case member 641. Lead wires 671, 671 as being a connecting part are inserted into the two slits 641a, 641a respectively.

In a stage prior to combining the second case member 641 and the substrate 5 with the first case member 603, the lead wires 671, 671 such as so-called a harness that has passed the slit 641a of the second case member 641 and the substrate 5 are electrically connected by the use of soldering or the like. A part of the lead wire 671 that is exposed outside constitutes the connecting part to be connected with the external device by itself. Since these operations are conducted not in a state that the substrate 5 is housed in the internal space (S) but in a stage that circumference of the substrate 5 is open, it is possible to conduct the operation efficiently, thereby improving the yield and reducing time to manufacture the sensor module 601A.

As mentioned above, the body case 602A is comprised by the second case member 641 and the substrate 5 electrically connected each other and the first case member 603, and it is possible to make a state that the substrate 5 with which the electric connection has been provided is housed in the internal space (S). Similar to the above-mentioned embodiments, with the following operation that the resin body 6 in a liquid state (refer to FIG. 1) is filled into the internal space (S) from the first opening P1 locating upside and hardened, it is possible to obtain the integrated sensor module 601A. In case of filling the resin body 6, since the second case member 641 is supported by the convex guide parts 622*a*, 624*a*, it is possible to keep a shape as the body case 602A without applying the pressure from the outside. As a result, it is possible to conduct the operation easily. In addition, since the second case member 641 is made of the elastic material, it is possible to keep a tightly sealed state by making use of the elastic restoring force of the second case member 641 in spite of a state that the lead wire 671 passes the slit 641*a*. As a result, the resin body 6 will not leak out through the slit 641*a*.

In accordance with this arrangement, since the lead wire 671 is protected also by the resin body 6 that has been hardened in the internal space (S), there would be no fear of disconnection due to separation from the substrate 5. In addition, since various types of the lead wire 671 and a length of the lead wire 671 can be easily tailored to the external device, it is possible to easily change the form of the sensor module 601A with using the same component.

Furthermore, a second case member 642 shown in FIG. 9(*b*) may be used instead of the second case member 641. Also in this case, the second case member 642 is inserted into inside of the first case member 603 so as to be a side wall 625B and constitutes a body case 602B together with the first case member 603. Then the substrate 5 is housed in the internal space (S) and the resin body 6 is filled in the internal space (S) and hardened so that the sensor module 601B is comprised.

A thickness of the second case member 642 is formed thicker than the above-mentioned second case member 641 (refer to FIG. 9(*a*)), and a convex part 642*b*, 642*c* is formed at a center in the thickness direction at both side end parts of the second case member 642 along the vertical direction. The convex part 642*b*, 642*c* can be inserted from the upside into each gap formed by the convex guide parts 622*a* and 622*a*, 624*a* and 624*a* formed on the first case member 603. With this arrangement, it is possible to make the surface where the second opening P2 is arranged generally flat.

With this arrangement, it is possible to tightly seal the second opening P2. In addition, even in case that the center of the second case member 642 is getting transformed in a state of inflating outside, since the above-mentioned transformation can be restrained by an abutting contact between a step formed in the thinness direction near the convex part 642*b*, 642*c* and a distal end of the convex guide part 622*a*, 624*a* of the first case member 603, it is possible to comprise a strong structure against the inside pressure. As a result, there would be no case that the resin body 6 leaks from a gap between the first case member 603 and the second case member 642 even though a case that the pressure of the resin body 6 goes up because a flowing rate of the resin body 6 into the internal space (S) is increased or the resin body 6 is changed to a denser resin body.

Also in case of using the above-mentioned second case member 642, following points are the same as those in the above-mentioned embodiments; the slit 642*a*, 642*a* is formed at the upper part and the lead wire 671, 671 as the connecting part passes the slit 642*a*, 642*a*, and an electric signal can be given and received between the substrate 5 and the external device.

In accordance with the above-mentioned arrangement, it is possible for either of this embodiment shown in FIGS. 9(*a*) and (*b*) to obtain the same effect as those of the first embodiment and the second embodiment.

Furthermore, since the sensor module 601A (601B) is so configured that the second case member 641 (642) is made of the elastic material and the second opening P2 is sealed by inserting the second case member 641 (642) into the first case member 603, it is possible both to easily assemble the body case 602A (602B) prior to filling the resin body 6 and to tightly seal the second opening P2 so as not to leak the resin body 6 to the outside even though the lead wire 671 passes the second case member 641 (642) through the slit 641*a* (642*a*), enabling more stable manufacturing the sensor module 601A (601B).

Sixth Embodiment

FIG. 10 shows a sensor module 701 of the sixth embodiment. FIG. 10(*a*) corresponds to FIG. 2(*a*), and shows a process of manufacturing the sensor module 701. FIG. 10(*b*) is a partially broken view showing a state that the sensor module 701 is completed after completion of the filling and hardening the resin body 6. In FIG. 10, the same parts as those in the first~fifth embodiments are denoted by the same reference numerals as those in the embodiment, and descriptions thereof will be omitted.

The sensor module 701 of this embodiment uses the first case member 603 (refer to FIG. 9) that is the same as that of the fifth embodiment and forms a body case 702 by combining the first case member 603 with a second case member 741 having a different shape and the resin body 6 is filled and hardened in a state that the substrate 5 is housed in the internal space (S).

The second case member 741 has a concave part 741*b* sinking in a direction of a thickness at a position locating in an upper part of the internal space (S) when assembled as the body case 702 over the whole of the width direction. In addition, similar to the fifth embodiment, a slit 741*a*, 741*a* for passing the lead wire 671, 671 is formed in an upper part of the second case member 741.

The second case member 741 and the substrate 5 are combined with the first case member 603 in a state that the lead wire 671 passes the slit 741*a* and the lead wire 671 is electrically connected with the substrate 5. In this case, the second case member 741 is inserted into the inside of the first case member 603, concretely the second case member 741 is inserted into a gap between convex guide members 622*a* and 622*a*, and a gap between convex guide members 624*a* and 624*a*, from the upside so that the body case 702 is formed by the second case member 741 and the first case member 603 while the second opening P2 is sealed. Conversely, in this stage, it is possible to separate the first case member 603 from the second case member 741 in a vertical direction. The above-mentioned concave part 741*b* is formed in a direction crossing the direction in which the first case member 603 can be separated from the second case member 741.

In addition, the substrate 5 is housed in the internal space (S) by being inserted into a gap between the convex guide members 622*b* and 622*b*, and a gap between the convex guide members 624*b* and 624*b* from the upside.

In this state, the integrated sensor module 701 as shown in FIG. 10(*b*) can be obtained by filling the resin body 6 in the liquid state from the first opening P1 and then hardening the resin body 6.

At this time, the concave part 741b is formed on the upper part in the inner surface of the second case member 741 and the concave part 741b works as a stopper when the resin body 6 is filled inside of the concave part 741b. Then a relative movement between the second case member 741 and the first case member 603 is prevented. As a result, the integrity of the sensor module 701 is further improved, thereby further improving the strength.

As mentioned above, since the function as the stopper is produced by the concave part 741b arranged in a direction crossing the direction to which the first case member 603 is separated from the second case member 741 and the resin body 6 is filled inside of the concave part 741b, it is possible to obtain the same effect even though the concave part 741b is arranged at any position of the inner surface of the second case member 741.

The sensor module 701 of this embodiment is so configured that the concave part 741b is formed on the inner surface of the second case member 741 as being one of the case members 603, 741 constituting the wall surface of the internal space (S) of the body case 702 in the direction crossing the direction to which the first case member 603 can be separated from the second case member 741 prior to filling the resin body 6.

In accordance with this arrangement, it is possible to restrain the relative movement of the case members 603, 741 in the direction of being separated by filling the resin body 6 into inside of the concave part 741b and by solidifying or hardening the resin body 6. As a result, it is possible to configure the integrated structure having a stronger strength.

A concrete configuration of each component is not limited to the above-mentioned embodiment.

For example, in the above-mentioned embodiment, the sensor module 1A (1B, 201, 301, 401A, 401B, 501A, 501B, 601A, 601B, 701) that houses the substrate 5 on which the sensor IC 51 as being an electric component having a detecting function is mounted is comprised, however, the sensor module may comprise other electric component that is different from the sensor IC 51.

In addition, in the above-mentioned embodiment, the body case 2 comprises two members, namely the first case member 3 and the second case member 4, however, the body case 2 may comprise three or more members. In this case, it is preferable to provide a different function for each case member such that a connecting part for electric connection is arranged for one case member, and a fixing part for mounting the body case 2 on an external device is arranged for the other case member.

In addition, in the above-mentioned embodiment, the second opening P2 that is continuous to the first opening P1 and that opens in the direction orthogonal to the first opening P1 is exposed by separating the first case member 3 from the second case member 4 constituting the body case 2, however, the first opening P1 and the second opening P2 may not be necessarily connected. Even though the first opening P1 is separated from the second opening P2, the above-mentioned effect may be obtained. Furthermore, it is not indispensable to arrange the second opening P2 at right angle to the first opening P1, and it is enough if the first opening P1 is formed to face the different direction from the second opening P2 depending on a shape of the body case 2.

In the above-mentioned embodiment, the second opening P2 is sealed by combining the first case member 3 and the second case member 4, however, the first opening P1 may be sealed instead of the second opening P2. Furthermore, it is also possible that a member to seal the first opening P1 and a member to seal the second opening P2 are prepared as a separated member and the members are selectively used. With this arrangement, furthermore variations are increased. In case that the first opening P1 is sealed instead of the second opening P2, the resin body 6 is filled from the second opening P2. Then the second opening P2 corresponds to a concept of "the first opening" in this invention. The first opening P1 and the second opening P2 are switched in a conception of the invention.

Other configuration may be variously modified without departing from a spirit of this invention.

EXPLANATION OF THE CODES 1A, 1B . . . sensor module (Electronic Module)
2 . . . body case
3 . . . first case member
4 . . . second case member
5 . . . substrate
6 . . . resin body
51 . . . sensor IC
R . . . direction of inflow (of resin body)
S . . . internal space
P1 . . . first opening
P2 . . . second opening

The invention claimed is:

1. An Electronic Module, comprising:
   a body case comprising a plurality of case members comprising a first case member and a second case member, the first case member making an abutting contact to the second case member, the body case having an internal space, a first opening formed on one side surface of the internal space, and a second opening that opens in a direction different from the first opening, the second opening opens when the second case member is separated from the first case member,
   a substrate on which an electronic component is mounted, the substrate being housed in the internal space, and
   a resin body that covers the substrate, the resin body filled into the internal space and solidified or hardened therein,
   wherein the second case member is inserted into the first case member to close the second opening,
   wherein a concave part is formed on the second case member opposite to the second opening and facing to the first opening prior to filling the resin body, and
   wherein said plurality of the case members and the substrate are integrated by the use of the resin body as an accouplement.

2. The Electronic Module described in claim 1,
   wherein a connecting part to give and receive an electronic signal to and from outside is arranged on the second case member, and
   wherein the substrate is electrically connected to the connecting part.

3. The Electronic Module described in claim 2, further comprising,
   a slit provided at an upper part of the second case member; and
   a lead wire inserted in the slit, the lead wire serving as the connecting part.

4. The Electronic Module described in claim 3, further comprising
   a first guide part formed on the first case member, the first guide part receiving the substrate in the internal space, and
   a second guide part formed on the first case member, the second guide part receiving the second case member.

5. The Electronic Module described in claim 2, further comprising
- a first guide part formed on the first case member, the first guide part receiving the substrate in the internal space, and
- a second guide part formed on the first case member, the second guide part receiving the second case member.

6. The Electronic Module described in claim 1, further comprising,
- a first guide part formed on the first case member, the first guide part receiving the substrate in the internal space, and
- a second guide part formed on the first case member, the second guide part receiving the second case member.

7. The Electronic Module described in claim 1, wherein the body case includes a top surface, a bottom surface, and four side surfaces, wherein the first opening is formed on the top surface, wherein the second opening is formed on one of the four side surfaces.

\* \* \* \* \*